United States Patent
Watanabe et al.

(10) Patent No.: US 9,397,529 B2
(45) Date of Patent: Jul. 19, 2016

(54) INVERTER-INTEGRATED ELECTRIC COMPRESSOR

(71) Applicant: MITSUBISHI HEAVY INDUSTRIES AUTOMOTIVE THERMAL SYSTEMS CO., LTD., Kiyosu-shi, Aichi (JP)

(72) Inventors: Takayuki Watanabe, Tokyo (JP); Ichiro Yogo, Tokyo (JP); Manabu Suzuki, Tokyo (JP)

(73) Assignee: Mitsubishi Heavy Industries Automotive Thermal Systems, Co., Ltd., Kiyosu-shi, Aichi (JP)

( * ) Notice: Subject to any disclaimer, the term of this patent is extended or adjusted under 35 U.S.C. 154(b) by 0 days.

(21) Appl. No.: 14/415,020

(22) PCT Filed: Jul. 30, 2013

(86) PCT No.: PCT/JP2013/070596
§ 371 (c)(1),
(2) Date: Jan. 15, 2015

(87) PCT Pub. No.: WO2014/038315
PCT Pub. Date: Mar. 13, 2014

(65) Prior Publication Data
US 2015/0188380 A1    Jul. 2, 2015

(30) Foreign Application Priority Data
Sep. 6, 2012  (JP) .................................. 2012-196087

(51) Int. Cl.
*H02K 11/00*    (2016.01)
*H02K 5/10*    (2006.01)
(Continued)

(52) U.S. Cl.
CPC *H02K 5/10* (2013.01); *F04B 35/04* (2013.01); *F04B 39/121* (2013.01); *F04B 49/06* (2013.01);
(Continued)

(58) Field of Classification Search
USPC ...................................................... 310/66 D
See application file for complete search history.

(56) References Cited

U.S. PATENT DOCUMENTS

2005/0063836 A1    3/2005 Kimura et al.
2009/0315417 A1    12/2009 Taguchi et al.
(Continued)

FOREIGN PATENT DOCUMENTS

CN    101490416 A    7/2009
CN    102046976 A    5/2011
(Continued)

OTHER PUBLICATIONS

Extended European Search Report for European Application No. 13835913.8, dated Oct. 12, 2015.
(Continued)

*Primary Examiner* — Hanh Nguyen
(74) *Attorney, Agent, or Firm* — Birch, Stewart, Kolasch & Birch, LLP

(57) ABSTRACT

In this inverter integrated type electric compressor, an inverter device is installed so as to be accommodated in an inverter housing portion and the inverter housing portion forms an airtight structure by tightly securing a cover piece to the inverter housing portion by means of a liquid gasket, a through-hole for ventilation and pressure testing, which penetrates into an internal space of the inverter housing portion, is provided at an outer wall of the cover piece, and a sealing means for sealing the through-hole is provided.

12 Claims, 4 Drawing Sheets

(51) Int. Cl.

| | | |
|---|---|---|
| *F04B 35/04* | (2006.01) | |
| *F04B 39/12* | (2006.01) | |
| *F04B 49/06* | (2006.01) | |
| *H02K 15/00* | (2006.01) | |
| *H05K 7/14* | (2006.01) | |
| *H02K 5/22* | (2006.01) | |
| *F04C 23/00* | (2006.01) | |
| *F04C 29/04* | (2006.01) | |

(52) U.S. Cl.
CPC ............... *F04C 23/008* (2013.01); *H02K 5/22* (2013.01); *H02K 11/0073* (2013.01); *H02K 11/33* (2016.01); *H02K 15/00* (2013.01); *H05K 7/1432* (2013.01); *F04C 29/047* (2013.01); *F04C 2240/30* (2013.01); *F04C 2240/808* (2013.01); *H02K 2205/09* (2013.01)

(56) References Cited

U.S. PATENT DOCUMENTS

| | | | |
|---|---|---|---|
| 2010/0018244 A1 | 1/2010 | Watanabe et al. | |
| 2011/0091337 A1 | 4/2011 | Suzuki et al. | |
| 2011/0217191 A1* | 9/2011 | Fujimra | F04B 39/121 417/410.1 |
| 2012/0045353 A1* | 2/2012 | Watanabe | F04B 35/04 417/410.1 |
| 2013/0049550 A1 | 2/2013 | Watanabe et al. | |
| 2013/0202411 A1 | 8/2013 | Ito | |
| 2013/0294951 A1 | 11/2013 | Ishikawa et al. | |

FOREIGN PATENT DOCUMENTS

| | | | |
|---|---|---|---|
| EP | 1978253 | A1 | 10/2008 |
| EP | 2322801 | A1 | 5/2011 |
| JP | 6-141504 | A | 5/1994 |
| JP | 2003-127802 | A | 5/2003 |
| JP | 2004-251161 | A | 9/2004 |
| JP | 2007-116870 | A | 5/2007 |
| JP | 2007-224902 | A | 9/2007 |
| JP | 2008-301541 | A | 12/2008 |
| JP | 2009-74469 | A | 4/2009 |
| JP | 2009-264172 | A | 11/2009 |
| JP | 2010-59941 | A | 3/2010 |
| JP | 2011-163231 | A | 8/2011 |
| JP | 2012-158988 | A | 8/2012 |
| JP | 2013-160077 | A | 8/2013 |

OTHER PUBLICATIONS

Chinese Office Action and Search Report, dated Jun. 12, 2015, for Chinese Application No. 201380038601.5 along with an English translation.

Notification on the Grant of Patent Right for Invention, issued Mar. 23, 2016, for corresponding Chinese Patent Application No. 201380038601.5 (with English translation).

* cited by examiner

INVERTER-INTEGRATED ELECTRIC COMPRESSOR

TECHNICAL FIELD

The present invention relates to an inverter integrated type electric compressor in which an inverter device is integrally installed in an inverter housing portion provided in a housing of the compressor.

BACKGROUND ART

Inverter integrated type electric compressors, in which an inverter device is integrally installed in a compressor housing, have been employed as the compressors of vehicle air conditioners for hybrid cars, electric automobiles, and the like. The inverter device converts high-voltage DC power supplied from a power source (battery) installed in a vehicle to three-phase AC power having a predetermined frequency based on control signals from an upper-level control device, and applies this three-phase AC power to the electric motor, thereby rotating the electric motor at a required rotational speed and driving the compressor.

The inverter device is provided with a board, on which a switching circuit having a plurality of semiconductor devices, a control circuit thereof, and so forth are mounted, and electrical components of a high-voltage system, such as a smoothing capacitor, an inductor coil, and so forth, and, although the inverter device is installed so as to be accommodated in an inverter housing portion, it is not resistant to moisture or the like. Because of this, the inverter housing portion has a cover piece with which the inverter housing portion forms an airtight structure. Known airtight seals employed in this cover piece include an O-ring, a gasket, a sealing material in which a rubber material is provided around a core wire, which are disclosed in Patent Literature 1, a liquid gasket, which is disclosed in Patent Literature 2, or the like.

CITATION LIST

Patent Literature

{PTL 1} Japanese Unexamined Patent Application, Publication No. 2007-224902
{PTL 2} Japanese Unexamined Patent Application, Publication No. 2010-59941

SUMMARY OF INVENTION

Technical Problem

In the case of an airtight sealed structure formed by using a liquid gasket, it is sufficient to harden the liquid gasket by bringing it into contact with air or the like after applying the liquid gasket to a seal surface and putting the cover piece on an object. Because of this, as compared with cases in which other solid sealing materials are employed, one advantage is that the cover piece can be airtightly sealed in a simple manner. However, the airtight structure is formed once the liquid gasket is hardened after placing the cover piece on the object. Because of this, it is difficult even just to check the airtight seal performance of the liquid gasket, which is performed by measuring the pressure while pressurizing or evacuating the inverter housing portion, unless the liquid gasket is destroyed.

The present invention is made in light of the above-described circumstances, and an object thereof is to provide an inverter integrated type electric compressor with which it is possible to guarantee the seal performance of a liquid gasket at a portion sealed in an airtight manner, to increase the airtight seal performance of the liquid gasket, and to enhance the product quality and reliability.

Solution to Problem

In order to solve the above-described problems, an inverter integrated type electric compressor of the present invention employs the following solutions.

Specifically, with an inverter integrated type electric compressor according to a first aspect of the present invention, the inverter integrated type electric compressor has an inverter device installed so as to be accommodated in an inverter housing portion and the inverter housing portion forms an airtight structure by tightly securing a cover piece to the inverter housing portion by means of a liquid gasket, the inverter integrated type electric compressor comprises the following elements: a through-hole provided on an outer wall of the cover piece so as to penetrate into an internal space of the invertor housing portion, for ventilation and pressure testing; and sealing means for sealing the through-hole.

With the first aspect of the present invention, in the inverter integrated type electric compressor in which the inverter housing portion forms an airtight structure by tightly securing, by means of the liquid gasket, the cover piece to the inverter housing portion in which the inverter device is installed so as to be accommodated therein, the through-hole for ventilation and pressure testing, which penetrates into the internal space of the inverter housing portion, is provided at the outer wall of the cover piece, and the sealing means for sealing the through-hole is provided. Because of this, even after the cover piece is tightly secured to the inverter housing portion by means of the liquid gasket and the inverter housing portion is sealed in an airtight manner by hardening the liquid gasket, by pressurizing or evacuating the interior of the inverter housing portion via the through-hole in the state in which the sealing means 16 is removed, and by measuring the pressure by checking pressure changes thereof, it is possible to check the airtight seal performance of the liquid gasket. Therefore, it is possible to guarantee the seal performance of the airtight seal portion by the liquid gasket, and it is possible to enhance the product quality and reliability. In addition, even after the inverter housing portion is tightly sealed by using the cover piece, the interior of the inverter housing portion can be ventilated via the through-hole, as needed, and thus, the liquid gasket can be hardened by bringing it into contact with the air. Because of this, it is possible to reliably enhance and stabilize the airtight seal performance of the liquid gasket. The through-hole is additionally utilized by inserting an industrial endoscope or the like via the through-hole, thus allowing to perform post-installation maintenance, inspections, or the like of the inverter housing portion while keeping the cover piece attached and without destroying the liquid gasket.

Furthermore, with an inverter integrated type electric compressor according to a second aspect of the present invention, in the above-described inverter integrated type electric compressor, the through-hole is formed as a screw hole, and a bolt serving as the sealing means is capable of being screwed into the screw hole.

With the second aspect of the present invention, the through-hole is formed as a screw hole, and the bolt, which is a sealing means, can be screwed into the screw hole. Because of this, even after the inverter housing portion is sealed in an airtight manner by using the cover piece, the inverter housing portion can be sealed in an airtight manner or opened in a simple manner and at any time merely by attaching/removing the bolt to/from the screw hole. Therefore, it is possible to perform, at any time, pressure testing for checking the airtight seal performance of the liquid gasket and post-installation maintenance, inspections, or the like of the interior portion. In addition, even after the airtight seal is established by using the cover piece, it is possible to further enhance and stabilize the airtight seal performance of the liquid gasket by further hardening the liquid gasket by bringing the liquid gasket into contact with the air by ventilating the interior of the inverter housing portion, as needed.

Furthermore, with an inverter integrated type electric compressor according to a third aspect of the present invention, in the above-described inverter integrated type electric compressor, the bolt as the sealing means is a bolt provided with a sealing member in which the sealing member is provided at a head portion or a screw portion of the bolt.

With the third aspect of the present invention, the bolt as sealing means is a bolt provided with a sealing member in which the sealing member is provided at the head portion or the screw portion thereof. Because of this, by screwing the bolt provided with the sealing member into the through-hole formed as a screw hole, it is possible to seal the through-hole in an airtight manner by using this sealing member, and it is possible to shut out air, moisture, or the like that may enter the inverter housing portion via the through-hole. Therefore, after the through-hole is sealed by the bolt, which is a sealing means, the inverter housing portion forms an airtight structure, and thus, it is possible to reliably suppress deterioration of the insulation characteristics or the like due to the entry of moisture or the like.

In addition, with an inverter integrated type electric compressor according to a fourth aspect of the present invention, in the above-described inverter integrated type electric compressor, the bolt provided with the sealing member is one selected from the bolts including: a bolt in which a resin sealing material is integrally molded at a flange of a head portion thereof; a bolt in which an O-ring or a sealing packing is provided at a neck of a head portion thereof; a bolt in which a sealer agent is applied to a head portion thereof; and a bolt in which Loctite is applied to a screw portion thereof.

With the fourth aspect of the present invention, the bolt provided with the sealing member is one selected from the bolts including: a bolt in which a resin sealing material is integrally molded at a flange of the head portion thereof; a bolt in which an O-ring or a sealing packing is provided at the neck of the head portion thereof; a bolt in which a sealer agent is applied to the head portion thereof; and a bolt in which Loctite ("Loctite" is a registered trademark of Henkel Corporation) is applied to the screw portion thereof. Because of this, regardless of which bolt provided with the sealing member is employed, it is possible to seal the through-hole in an airtight manner by using the respective sealing members, and it is possible to shut out air, moisture, or the like that may enter the inverter housing portion via the through-hole. Therefore, it is possible to ensure the airtightness of the inverter housing portion, and it is possible to reliably suppress the occurrence of problems caused by moisture or the like entering the interior. Note that, as the bolt provided with the sealing member, the bolt in which a resin sealing material is integrally molded at a flange of the head portion thereof is particularly desirable from the viewpoint of preventing electrolytic corrosion due to contact between different types of metals.

Furthermore, with an inverter integrated type electric compressor according to a fifth aspect of the present invention, in any one of the above-described inverter integrated type electric compressors, the through-hole is provided at a top surface of the cover piece, and a seat surface is formed at a periphery of the through-hole.

With the fifth aspect of the present invention, the through-hole is provided at a top surface of the cover piece, and the seat surface is formed at the periphery thereof. Because of this, when performing pressure testing work for checking the airtight seal performance of the liquid gasket, by making the suction cup adhere, from above, to the through-hole provided at the top surface of the cover piece by utilizing the seat surface formed at the periphery thereof, in the state in which the sealing means is removed, and by adjusting the internal pressure of the inverter housing portion via the suction cup, it is possible to accurately check the airtightness of the inverter housing portion. In addition, when sealing the through-hole by using the bolt provided with the sealing member, the through-hole can be sealed by utilizing the seat surface as a seal surface of the sealing member. By doing so, it is possible to make the pressure testing work easier and more accurate, and to further enhance the airtight seal performance of the inverter housing portion.

Advantageous Effects of Invention

With the present invention, even after the cover piece is tightly secured to the inverter housing portion by means of the liquid gasket and the inverter housing portion is sealed in an airtight manner by hardening the liquid gasket, by pressurizing or evacuating the interior of the inverter housing portion via the through-hole in the state in which the sealing means is removed and by testing the pressure by checking pressure changes thereof, it is possible to check the airtight seal performance of the liquid gasket. Because of this, it is possible to guarantee the seal performance of the airtight seal portion by the liquid gasket, and it is possible to enhance the product quality and reliability. In addition, even after the inverter housing portion is tightly sealed by using the cover piece, the interior of the inverter housing portion can be ventilated via the through-hole, as needed, and thus, the liquid gasket can be hardened by bringing it into contact with air. Because of this, it is possible to reliably enhance and stabilize the airtight seal performance of the liquid gasket. The through-hole is additionally utilized by inserting an industrial endoscope or the like via the through-hole, thus allowing to perform post-installation maintenance, inspections, or the like of the inverter housing portion while keeping the cover piece attached and without destroying the liquid gasket.

DESCRIPTION OF EMBODIMENT

An embodiment of the present invention will be described below with reference to FIGS. 1 to 4.

Figure 1:
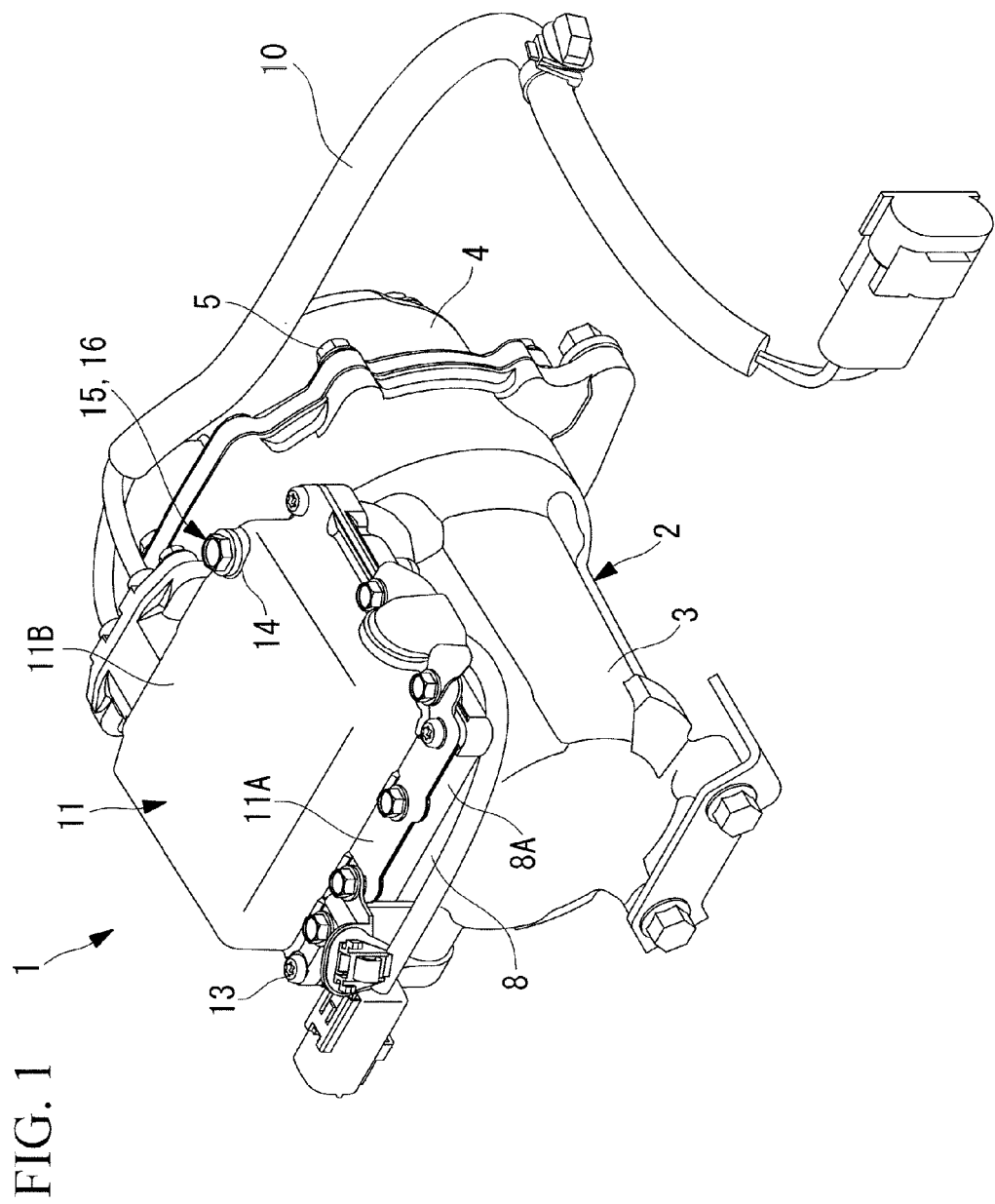
FIG. 1 is a perspective view showing the external appearance of an inverter integrated type electric compressor according to an embodiment of the present invention.
Figure 2:
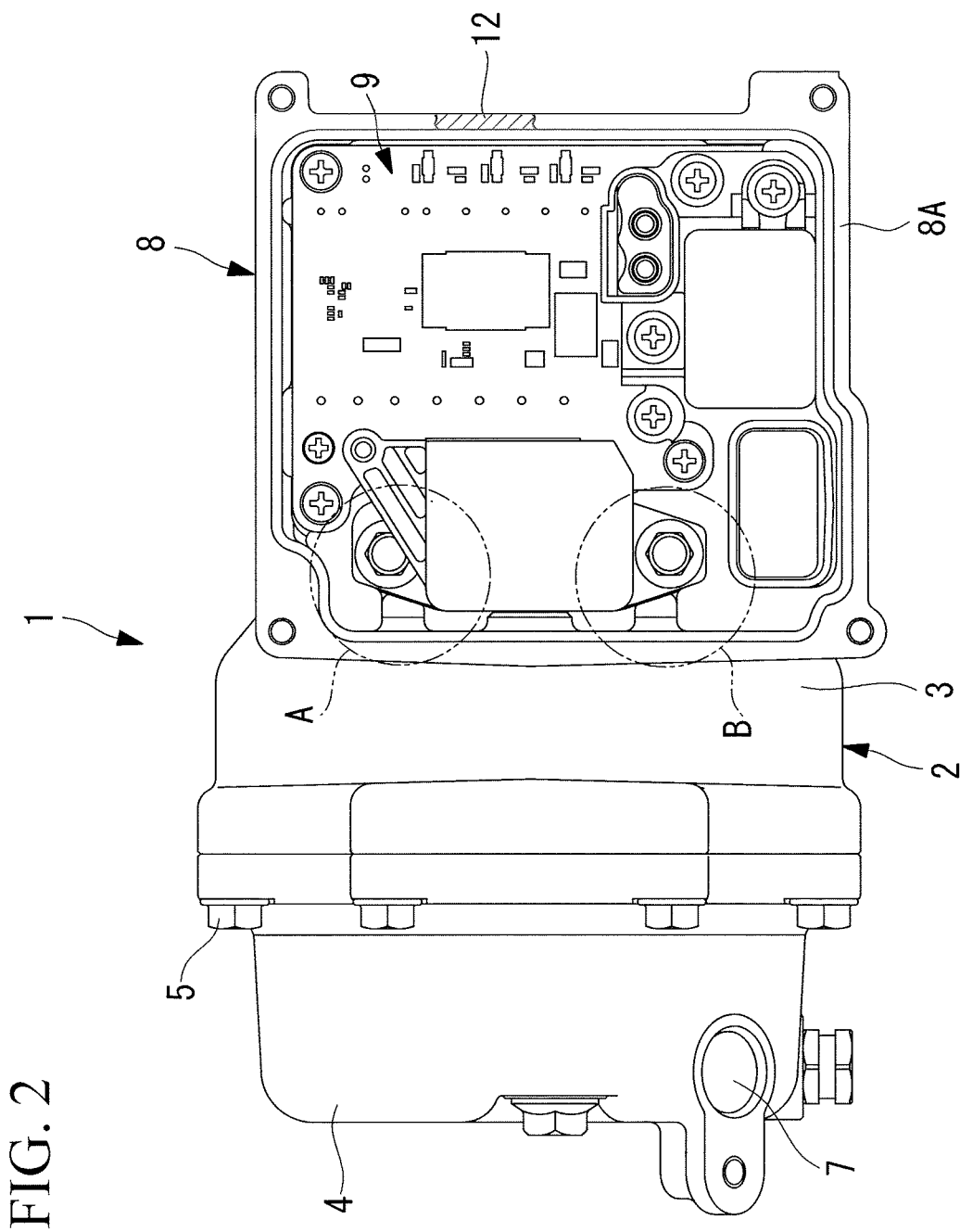
FIG. 2 is a plan view showing a state in which a cover piece of the inverter integrated type electric compressor shown in FIG. 1 is removed.
Figure 3:
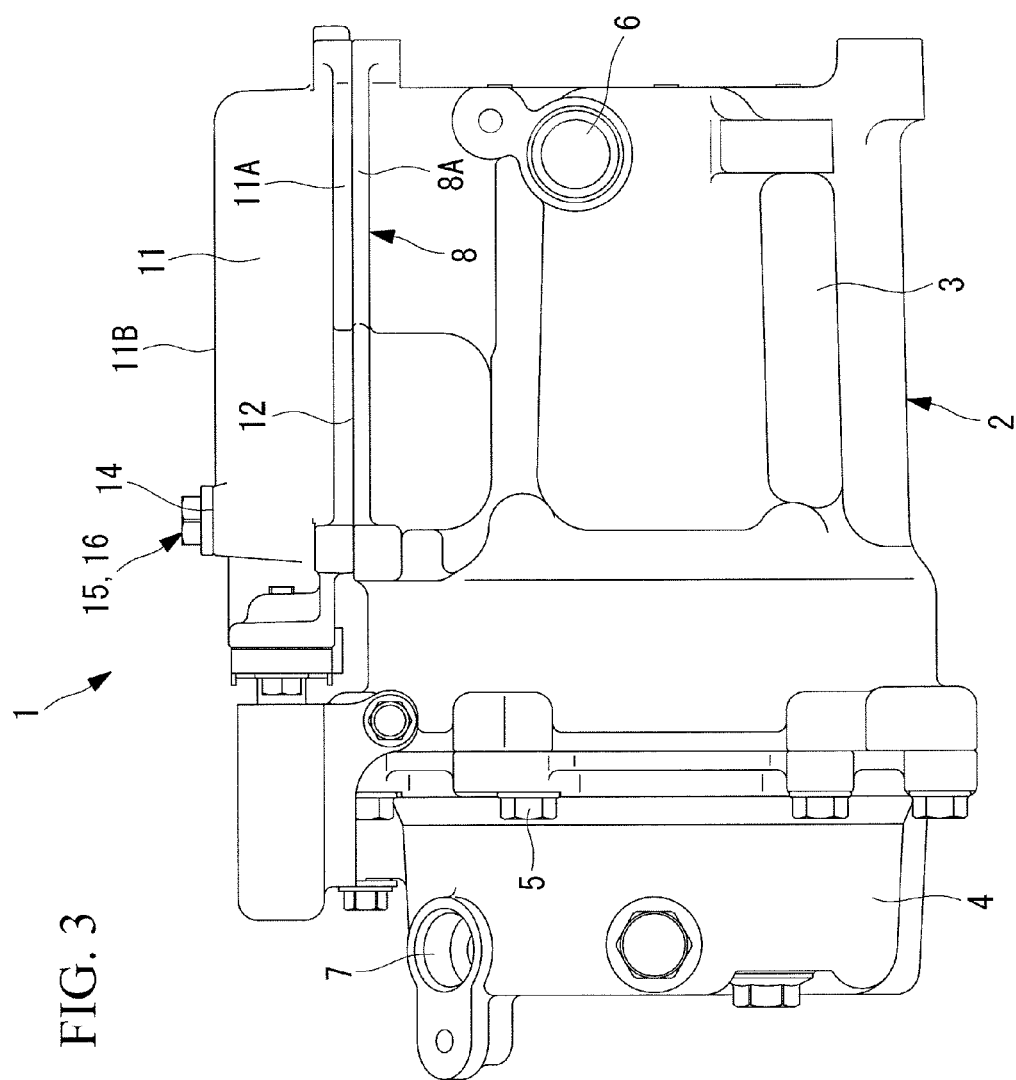
FIG. 3 is a side view of the inverter integrated type electric compressor in FIG. 1.

FIG. 1 is a perspective view showing the external appearance of an inverter integrated type electric compressor according to the embodiment of the present invention, FIG. 2 is a plan view showing a state in which a cover piece thereof is removed, and, additionally, FIG. 3 shows a side view thereof.

An inverter integrated type electric compressor 1 is provided with a housing 2. The housing 2 is constituted of a motor housing 3 inside which an electric motor is installed, and a compressor housing 4 inside which a compressor is installed, and the two housings 3 and 4 form a single unit by tightly joining them at flange portions thereof by means of bolts 5.

A refrigerant inlet 6 is provided at the rear end of the motor housing 3 so that low-pressure refrigerant gas which has circulated through a refrigeration cycle can be taken into the motor housing 3. The refrigerant gas flows around the electric motor at the interior thereof in the axial direction, and is taken into the compressor. This low-pressure refrigerant gas is compressed into high-temperature, high-pressure gas in the compressor, and is discharged toward the refrigeration cycle from an outlet 7 that opens at the front end of the compressor housing 4. Note that the electric motor and the compressor provided inside the housing 2 are well-known systems, and thus, descriptions thereof will be omitted.

In this embodiment, an inverter housing portion 8 is provided at an outer periphery of the motor housing 3 of the housing 2, and an inverter device 9 is installed so as to be accommodated therein (see FIG. 2). This inverter device 9 converts high-voltage DC power supplied thereto from a power-source unit (battery) installed in a vehicle via a power-source cable 10 to three-phase AC power having a predetermined frequency based on control signals from an upper-level control device, and applies that three-phase AC power to the electric motor. By doing so, the electric motor is rotated at a required rotational speed, and the compressor is driven. Note that the inverter device 9 itself is provided with a control board on which a switching circuit having a plurality of semiconductor devices and a control circuit thereof are mounted, and the inverter device 9 is also provided with components of a high-voltage system such as a smoothing capacitor, an inductor coil, and so forth. Because the inverter device 9 is a known system, a description thereof will be omitted.

The inverter housing portion 8 is configured so as to be sealed in an airtight manner by using the cover piece 11 after the inverter device 9 is installed so as to be accommodated therein. Note that, in the case of this embodiment, it is assumed that some of the components that constitute a part of the inverter device 9 are also mounted on the cover piece 11. Flange portions 8A and 11A are individually provided at peripheries of the inverter housing portion 8 and the cover piece 11. The interior of the inverter housing portion 8 is sealed in an airtight manner by means of a liquid gasket 12 by tightly securing the cover piece 11 by using bolts 13 after the liquid gasket 12 is applied to the entire periphery of the flange surface of the flange portion 8A (in FIG. 2, the shaded portion indicates, though only partially, the state in which the liquid gasket 12 is applied).

The liquid gasket 12 may be a known liquid gasket, and the liquid gasket employed in this case hardens by reacting with moisture in the air when coming into contact with the air. As described above, by leaving the liquid gasket 12 for a predetermined amount of time after it is thinly applied to the flange surface and the cover piece 11 is tightly secured thereto, the liquid gasket 12 hardens, thus achieving tight-contact sealing performance. Note that, although the flange surface on which the liquid gasket 12 is applied may be an entirely flat surface, a portion on the inner circumferential side of the flange surface may be a tapered surface whose gap between the opposite flange surface slightly increases in the inward direction. In this case, the liquid gasket 12 that has moved inward while tightly securing the cover piece 11 hardens in the gap portion becoming broader in a tapered shape, and thus it is possible to increase the adhesive strength against removal of the cover piece.

Figure 4:
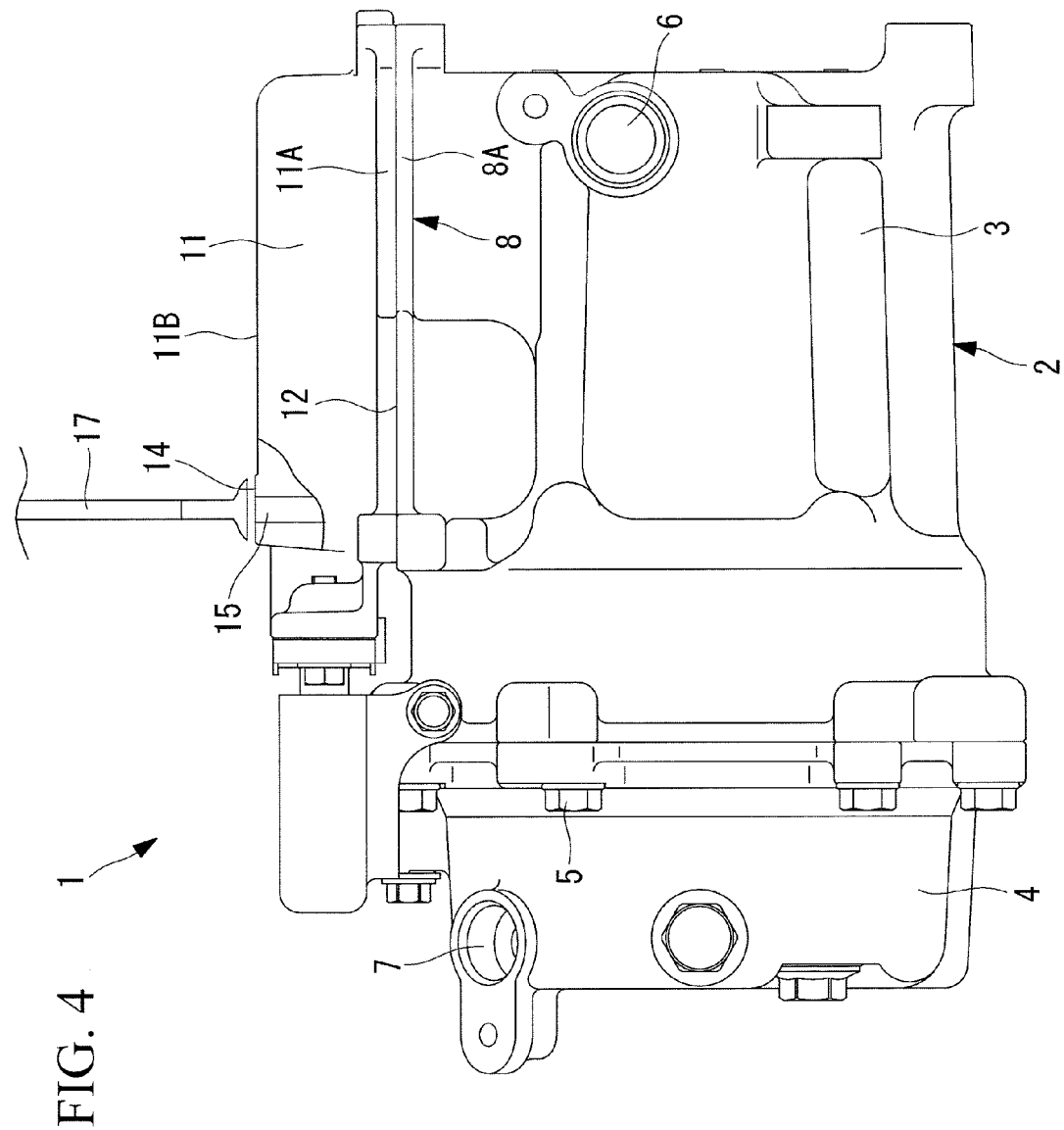
FIG. 4 is a side view showing a state in which a bolt, which serves as a sealing means, is not attached to the cover piece of the inverter integrated type electric compressor shown in FIG. 1 and a state in which pressure testing of the interior of an inverter housing portion is being performed.

On the other hand, a seat surface 14 is formed at one corner of a top-surface outer wall 11B of the cover piece 11, and, as shown in FIG. 4, a through-hole (screw hole) 15 for ventilation and pressure testing, which penetrates into the internal space of the inverter housing portion 8, is provided at this seat surface 14. This through-hole 15 is mainly used as a pressure testing hole for checking the airtight seal performance of the liquid gasket 12 by pressurizing and evacuating the interior of the inverter housing portion 8. As shown in FIG. 2, it is desirable that the through-hole 15 be provided at a position A or a position B located away from main components of the inverter device 9 provided inside the inverter housing portion 8.

Note that, by performing a pressure testing step in which, for example, as shown in FIG. 4, a suction cup 17 is lowered from above onto the seat surface 14 of the cover piece 11, where the through-hole 15 is provided, so as to come into close contact therewith, and pressure changes at the interior of the inverter housing portion 8 is checked while pressurizing or evacuating the interior of the inverter housing portion 8 via the suction cup 17, the airtight seal performance of the liquid gasket 12 can automatically be checked in this pressure testing step.

After the airtight seal performance is checked via the pressure testing step, the through-hole (screw hole) 15 is sealed by screwing thereinto a bolt (sealing means) 16 that serves as a sealing means. Because of this, the through-hole 15 is formed as a screw hole. In addition, in order to prevent the entry of the air or the like via the through-hole 15, the bolt 16, serving as the sealing means, is assumed to be a bolt provided with a sealing member, in which the sealing member is provided at the head portion or the screw portion thereof. A bolt having any of the following configurations can be used as the bolt 16 provided with the sealing member.

(1) A bolt in which a resin sealing material is integrally molded at a flange of the head portion thereof;
(2) A bolt in which an O-ring or a sealing packing is provided at the neck of the head portion thereof;
(3) A bolt in which a sealer agent (Sealer) is applied to the head portion thereof; and
(4) A bolt in which Loctite is applied to the screw portion thereof (where "Loctite" is a registered trademark of Henkel Corporation).

Among these bolts, the bolt in which a resin sealing material is integrally molded at the flange of the head portion thereof, which is described in (1), is most desirable from the viewpoint of, among others, preventing electrolytic corrosion due to contact between different types of metals. By sealing the through-hole (screw hole) 15 by using the thus-configured bolt 16, it is possible to form the inverter housing portion 8 as an airtight structure.

As described above, this embodiment can achieve the following advantages.

The cover piece 11 is tightly secured to the inverter housing portion 8 in which the inverter device 9 is installed so as to be accommodated therein, by means of the bolts 13 via the liquid gasket 12, and the inverter housing portion 8 is sealed in an airtight manner by means of this liquid gasket 12. Because of this, it is possible to seal the inverter housing portion 8 in an airtight and a simple manner merely by applying the liquid gasket 12 to the flange surface of the flange portion 8A of the inverter housing portion 8, without having to use a solid sealing material or the like, and thus it is possible to suppress deterioration of the insulating performance due to the entry of air, moisture, or the like.

In addition, the through-hole (screw hole) 15 for ventilation and pressure testing, which penetrates into the internal space of the inverter housing portion 8, is provided at the top-surface outer wall 11B of the cover piece 11 which seals the inverter housing portion 8 in an airtight manner, and the sealing means (bolt) 16 for sealing this through-hole 15 is provided. Because of this, even after the cover piece 11 is tightly secured to the inverter housing portion 8 by means of the liquid gasket 12 and the inverter housing portion 8 is sealed in an airtight manner by hardening the liquid gasket 12, by pressurizing or evacuating the interior of the inverter housing portion 8 via the through-hole 15 in the state in which the sealing means (bolt) 16 is removed and by testing the pressure by measuring pressure changes thereof, it is possible to check the airtight seal performance of the liquid gasket 12.

Therefore, it is possible to guarantee the seal performance of the airtight seal portion by the liquid gasket 12, and it is possible to enhance the product quality and reliability of the inverter integrated type electric compressor 1. In addition, even after the inverter housing portion 8 is sealed in the airtight manner by using the cover piece 11, the interior of the inverter housing portion 8 can be ventilated via the through-hole 15, as needed, and thus, the liquid gasket 12 can be hardened by bringing it into contact with the air. Because of this, it is possible to reliably enhance and stabilize the airtight seal performance of the liquid gasket 12. The through-hole 15 is additionally utilized by inserting an industrial endoscope or the like via the through-hole 15, thus allowing to perform post-installation maintenance, inspections, or the like of the interior of the inverter housing portion 8 while keeping the cover piece 11 attached and without destroying the liquid gasket 12.

In addition, the through-hole 15 is formed as a screw hole, and the bolt 16, which is a sealing means, can be screwed into the screw hole 15. Because of this, even after the inverter housing portion 8 is sealed in an airtight manner by using the cover piece 11, the inverter housing portion 8 can be sealed in an airtight manner or opened in a simple manner at any time merely by attaching/removing the bolt 16 to/from the screw hole 15. Therefore, it is possible to perform, at any time, pressure testing for checking the airtight seal performance of the liquid gasket 12 and post-installation maintenance, inspections, or the like of the interior portion, and, even after the airtight seal is established by using the cover piece 11, it is possible to further enhance and stabilize the airtight seal performance of the liquid gasket 12 by further hardening the liquid gasket 12 by bringing the liquid gasket 12 into contact with the air by ventilating the interior of the inverter housing portion 8, as needed.

Furthermore, the bolt 16 that seals the through-hole (screw hole) 15 is a bolt 16 provided with a sealing member, in which the sealing member is provided at the head portion or the screw portion thereof. Because of this, by screwing the bolt 16 provided with a sealing member into the through-hole 15 formed as a screw hole, it is possible to seal the through-hole 15 in an airtight manner by using this sealing member, and it is possible to shut out air, moisture, or the like that may enter the inverter housing portion 8 via the through-hole 15. Therefore, after the through-hole 15 is sealed by the bolt 16, which is a sealing means, the inverter housing portion 8 forms an airtight structure, and thus, it is possible to reliably suppress deterioration of insulation characteristics or the like due to the entry of moisture or the like.

In addition, with respect to the above-described bolt 16 provided with the sealing member, it is possible to employ a bolt 16 selected from the following configurations: (1) a bolt in which a resin sealing material is integrally molded at a flange of the head portion thereof; (2) a bolt in which an O-ring or a sealing packing is provided at the neck of the head portion thereof; (3) a bolt in which a sealer agent is applied to the head portion thereof; and (4) a bolt in which Loctite is applied to the screw portion thereof. Regardless of which bolt 16 provided with the sealing member is employed, it is possible to seal the through-hole 15 in an airtight manner by using the respective sealing members, and it is possible to shut out air, moisture, or the like that may enter the inverter housing portion 8 via the through-hole 15.

Therefore, it is possible to ensure the airtightness of the inverter housing portion 8, and it is possible to reliably suppress the occurrence of problems caused by moisture or the like entering the interior. Note that, among the bolts 16 provided with the sealing members, which are described above in (1) through (4), the bolt in which a resin sealing material is integrally molded at a flange of the head portion thereof, which is described in (1), is particularly desirable from the viewpoint of preventing electrolytic corrosion due to contact between different types of metals.

Furthermore, the through-hole 15 is provided at the top-surface outer wall 11B of the cover piece 11, and the seat surface 14 is formed at the periphery of the through-hole 15. Because of this, when performing pressure testing work for checking the airtight seal performance of the liquid gasket 12, by making the suction cup 17 adhere, from above, to the through-hole 15 provided at the top-surface outer wall 11B of the cover piece 11 by utilizing the seat surface 14 formed at the periphery of the through-hole 15, in the state in which the bolt 16, which is a sealing means, is not attached, and by adjusting the internal pressure of the inverter housing portion 8 via the suction cup 17, it is possible to accurately check the airtightness of the inverter housing portion 8. In addition, when sealing the through-hole 15 by using the bolt 16 provided with a sealing member, the through-hole 15 can be sealed by utilizing the seat surface 14 as a seal surface of the sealing member. Therefore, it is possible to make the pressure testing work easier and more accurate, and to further enhance the airtight seal performance of the inverter housing portion 8.

Note that the present invention is not limited to the invention according to the above-described embodiment, and appropriate modifications are possible within a scope that does not depart from the scope of the present invention. For example, with the above-described embodiment, although the example in which the inverter housing portion 8 is provided at a top surface of the outer circumference of the motor housing 3 has been described, the inverter housing portion 8 may be provided at an end surface of the motor housing 3 or an end surface of the compressor housing 4. In addition, the position at which the through-hole 15 is provided is not limited only to the position of the top-surface outer wall 11B of the cover piece 11 as described in the above-described embodiment, and the position may appropriately be changed.

Furthermore, regarding the pressure testing method for checking the airtight seal performance of the liquid gasket 12, aside from the pressure testing method in which the suction cup 17 is made to adhere to the through-hole 15 as described in the above-described embodiment, for example, a pressure testing method in which a screw plug is connected by utilizing the through-hole 15, which is a screw hole, and in which the pressure inside the inverter housing portion 8 is adjusted via the screw plug or any other methods may be employed.

REFERENCE SIGNS LIST 1 inverter integrated type electric compressor
2 housing
3 motor housing
8 inverter housing portion
9 inverter device
11 cover piece
11B top-surface outer wall
12 liquid gasket
14 seat surface
15 through-hole (screw hole)
16 sealing means (bolt)
17 suction cup

The invention claimed is:

1. An inverter integrated type electric compressor in which an inverter device is installed so as to be accommodated in an inverter housing portion and in which the inverter housing portion forms an airtight structure by tightly securing a cover piece, the inverter integrated type electric compressor comprising:
a through-hole provided on an outer wall of the cover piece so as to penetrate into an internal space of the invertor housing portion, for pressure testing; and
sealing means for sealing the through-hole.

2. The inverter integrated type electric compressor according to claim 1, wherein the through-hole is formed as a screw hole, and a bolt serving as the sealing means is capable of being screwed into the screw hole.

3. The inverter integrated type electric compressor according to claim 2, wherein the bolt as the sealing means is a bolt provided with a sealing member in which the sealing member is provided at a head portion or a screw portion of the bolt.

4. The inverter integrated type electric compressor according to claim 3, wherein the bolt provided with the sealing member is one selected from the bolts including: a bolt in which a resin sealing material is integrally molded at a flange of a head portion thereof; a bolt in which an O-ring or a sealing packing is provided at a neck of a head portion thereof; a bolt in which a sealer agent is applied to a head portion thereof; a bolt in which Loctite is applied to a screw portion thereof; and etc.

5. The inverter integrated type electric compressor according to claim 1, wherein the through-hole is provided at a top surface of the cover piece, and a seat surface is formed at a periphery of the through-hole.

6. The inverter integrated type electric compressor according to claim 5, wherein the seat surface is utilized as a seal surface, and a seal structure is made by sandwiching the sealing member with a head portion of the bolt and the seal surface.

7. An inverter integrated type electric compressor in which an inverter device is installed so as to be accommodated in an inverter housing portion and in which the inverter housing portion forms an airtight structure by a cover piece, the inverter integrated type electric compressor comprising:
a through-hole provided on an outer wall of the cover piece so as to penetrate into an internal space of the inverter housing portion, for pressure testing;
sealing means for sealing the through-hole; and
a seat surface formed at a periphery of the through-hole.

8. A method of manufacturing an inverter integrated type electric compressor in which an inverter device is installed so as to be accommodated in an inverter housing portion and in which the inverter housing portion forms an airtight structure by a cover piece, the inverter integrated type electric compressor comprising:
a through-hole provided on an outer wall of the cover piece or the cover piece so as to penetrate into an internal space of the inverter housing portion; and
sealing means detachably attached to the through-hole, for sealing the through-hole,
the method comprising:
a step of sealing the inverter housing portion by the cover piece;
a step of checking airtight seal performance by pressure testing in the inverter housing portion through the through-hole after the sealing step; and
a step of forming the airtight structure by sealing the through-hole with the sealing means after the checking step.

9. An inverter integrated type electric compressor in which an inverter device is installed so as to be accommodated in an inverter housing portion provided at a housing side and in which the inverter housing portion forms an airtight structure by tightly securing a cover piece to the inverter housing portion by means of a liquid gasket, the inverter integrated type electric compressor comprising:
a through-hole provided on an outer wall of the cover piece so as to penetrate into an internal space of the inverter housing portion, for pressure testing, inspection, pressurizing, evacuating, or ventilation to harden the liquid gasket; and
sealing means detachably attached to the through-hole, for sealing the through-hole.

10. An inverter integrated type electric compressor in which an inverter device is installed so as to be accommodated in an inverter housing portion and in which the inverter housing portion forms an airtight structure by a cover piece, the inverter integrated type electric compressor comprising:
a through-hole provided on an outer wall of the cover piece so as to penetrate into an internal space of the inverter housing portion, for pressurizing the internal space and making pressure inside the internal space a negative pressure or evacuating; and
sealing means for sealing the through-hole.

11. A cover piece of an inverter integrated type electric compressor in which an inverter device is installed so as to be accommodated in an inverter housing portion and in which the inverter housing portion forms an airtight structure by the cover piece, the cover piece comprising:
a through-hole provided on an outer wall of the cover piece so as to penetrate into an internal space of the inverter housing portion, for pressure testing, pressurizing the internal space, and making pressure inside the internal space a negative pressure; and
sealing means for sealing the through-hole.

12. A cover piece of an inverter integrated type electric compressor in which an inverter device is installed so as to be accommodated in an inverter housing portion provided at a housing side and in which the inverter housing portion forms an airtight structure by tightly securing a cover piece to the inverter housing portion by means of a liquid gasket, the cover piece comprising:
a through-hole provided on an outer wall of the cover piece so as to penetrate into an internal space of the inverter housing portion, for pressure testing, inspection, pressurizing, evacuating, or ventilation to harden the liquid gasket; and
sealing means for sealing the through-hole.

* * * * *